US010809785B2

(12) United States Patent
Li et al.

(10) Patent No.: US 10,809,785 B2
(45) Date of Patent: Oct. 20, 2020

(54) ELECTRONIC DEVICE, METHOD FOR OPERATING THE SAME, AND WIRELESS CONTROLLABLE ELECTRONIC ASSEMBLY

(71) Applicant: TPK Glass Solutions (Xiamen) Inc., Xiamen (CN)

(72) Inventors: Chao-Sung Li, Hsinchu (TW); Lien-Hsin Lee, Taipei (TW); Jui-Hsing Li, Taoyuan (TW)

(73) Assignee: TPK Glass Solutions (Xiamen) Inc., Xiamen (CN)

( * ) Notice: Subject to any disclaimer, the term of this patent is extended or adjusted under 35 U.S.C. 154(b) by 0 days.

(21) Appl. No.: 16/224,824

(22) Filed: Dec. 19, 2018

(65) Prior Publication Data

US 2019/0187767 A1      Jun. 20, 2019

(30) Foreign Application Priority Data

Dec. 19, 2017 (CN) .......................... 2017 1 1373096

(51) Int. Cl.
*G06F 1/26* (2006.01)
*G06F 3/041* (2006.01)
*G06F 3/044* (2006.01)
*G01R 17/10* (2006.01)
*G06F 1/16* (2006.01)

(52) U.S. Cl.
CPC .............. *G06F 1/263* (2013.01); *G06F 3/044* (2013.01); *G06F 3/0414* (2013.01); *G01R 17/105* (2013.01); *G06F 1/1698* (2013.01); *G06F 2203/04105* (2013.01)

(58) Field of Classification Search
CPC ........ G06F 3/0414; G06F 3/044; G06F 1/263; G06F 2203/04105
USPC .......................................................... 345/174
See application file for complete search history.

(56) References Cited

U.S. PATENT DOCUMENTS

| 5,804,978 | A | * | 9/1998 | Scheerer | ................ | G01D 3/036 |
| | | | | | | 324/610 |
| 2010/0123675 | A1 | * | 5/2010 | Ippel | ....................... | G06F 3/044 |
| | | | | | | 345/173 |
| 2011/0004276 | A1 | * | 1/2011 | Blair | ..................... | A61B 5/0002 |
| | | | | | | 607/60 |
| 2017/0315653 | A1 | * | 11/2017 | Vandermeijden | ..... | G06F 3/0416 |
| 2017/0336902 | A1 | * | 11/2017 | Smith | .................... | G06F 3/0416 |

* cited by examiner

*Primary Examiner* — Mark Edwards
(74) *Attorney, Agent, or Firm* — Cooper Legal Group, LLC

(57) ABSTRACT

An electronic device includes a substrate, a Wheatstone bridge circuit, a power module, and a controller. The Wheatstone bridge circuit includes a first pressure sensing electrode disposed on the substrate. A resistance of the first pressure sensing electrode varies with pressure applied to the first pressure sensing electrode. The first pressure sensing electrode is coil-shaped. The power module is electrically connected to the Wheatstone bridge circuit. The controller is configured to control the power module to provide direct current (DC) to the Wheatstone bridge circuit within a first period of time, and to control the power module to provide alternating current (AC) to the Wheatstone bridge circuit within a second period of time.

20 Claims, 10 Drawing Sheets

ELECTRONIC DEVICE, METHOD FOR OPERATING THE SAME, AND WIRELESS CONTROLLABLE ELECTRONIC ASSEMBLY

RELATED APPLICATIONS

This application claims priority to China Application Number 201711373096.6, filed Dec. 19, 2017, which is herein incorporated by reference.

BACKGROUND

Technical Field

The present disclosure relates to an electronic device, a method for operating the electronic device, and a wireless controllable electronic assembly Description of Related Art Developers of consumer products, such as mobile phones, mobile navigation systems, mobile game devices, and mobile media players, are searching for new input methods. A conventional touch device that is often used is a detector which can receive an input signal in response to touch. In addition to detecting a touch position, the conventional touch device further integrates a function of sensing a magnitude of touch pressure. Identification of the magnitude of touch pressure provides an additional degree of freedom and may be adapted to different input types, such as stylus, fingers, and gloved fingers.

In order to perform wireless-signal communication with another remote device, an additional wireless-signal module has to be introduced into the above-mentioned consumer product, so as to achieve a function of wireless-signal communication.

SUMMARY

The present disclosure is to provide an electronic device which not only senses pressure through a pressure sensing component but also generates a wireless signal through the pressure sensing component, thereby communicating with another remote device for wireless-signal transmission.

The present disclosure is to provide an electronic device including a substrate, a Wheatstone bridge circuit, a power module, and a controller. The Wheatstone bridge circuit includes a first pressure sensing electrode disposed on the substrate. A resistance of the first pressure sensing electrode varies with pressure applied to the first pressure sensing electrode. The first pressure sensing electrode is coil-shaped. The power module is electrically connected to the Wheatstone bridge circuit. The controller is configured to control the power module to provide direct current (DC) to the Wheatstone bridge circuit within a period of time, and to control the power module to provide alternating current (AC) to the Wheatstone bridge circuit within another period of time.

In some embodiments, the power module includes a DC power source and a DC-to-AC converter. The DC-to-AC converter is electrically connected to the DC power source and the controller.

In some embodiments, the power module includes an AC power source and an AC-to-DC converter. The AC-to-DC converter is electrically connected to the AC power source and the controller.

In some embodiments, the Wheatstone bridge circuit further includes a second pressure sensing electrode. The first pressure sensing electrode and the second pressure sensing electrode are respectively disposed on opposite surfaces of the substrate, a resistance of the second pressure sensing electrode varies with pressure applied to the second pressure sensing electrode, and the second pressure sensing electrode is coil-shaped.

In some embodiments, the electronic device further includes a cover plate that covers the substrate and has a transparent area and an opaque area. The opaque area is located at a side of the transparent area, and the power module is covered by the opaque area.

In some embodiments, the first pressure sensing electrode is covered by the transparent area.

In some embodiments, the electronic device further includes a flexible circuit board disposed on the substrate, in which the controller is disposed on the flexible circuit board.

In some embodiments, the electronic device further includes a galvanometer electrically connected to the first pressure sensing electrode and configured to detect a variation of the resistance of the first pressure sensing electrode caused by the pressure applied to the first pressure sensing electrode.

In some embodiments, the electronic device further includes a touch sensing electrode. A vertical projection of the touch sensing electrode on the substrate at least partially overlaps with a vertical projection of the first pressure sensing electrode on the substrate.

The present disclosure is to provide a wireless controllable electronic assembly including the aforementioned electronic device and a remote device. The remote device includes a magnetic field sensing component and an actuator. The magnetic field sensing component is configured to receive and modulate a wireless signal emitted from the electronic device to generate a control signal when the AC is applied to the Wheatstone bridge circuit of the electronic device and when the first pressure sensing electrode of the electronic device is pressed. The actuator is configured to change a function state of the remote device according to the control signal generated by the magnetic field sensing component.

The present disclosure is to provide a method for operating an electronic device, and the method includes the following steps. In a first period of time, DC is provided to a Wheatstone bridge circuit of the electronic device. In the first period of time, a resistance variation is detected when the pressure sensing electrode of the Wheatstone bridge circuit is under pressure to cause a resistance variation of a pressure sensing electrode. In the first period of time, according to the resistance variation, a value of the pressure applied to the pressure sensing electrode is obtained. In a second period of time that is different than the first period of time, alternating current (AC) is provided to the Wheatstone bridge circuit of the electronic device. In the second period of time, a wireless signal is transmitted when the pressure sensing electrode of the Wheatstone bridge circuit is under pressure to cause another resistance variation of the pressure sensing electrode.

In the above embodiments, during the period of time within which AC is provided, when the coil-shaped pressure sensing electrode is pressed to cause deformation, the Wheatstone bridge circuit including the pressure sensing electrode may produce an alternating magnetic field due to the circuit loop function, thereby transmitting a wireless signal in a form of electromagnetic wave to represent the magnitude of the deformation. Furthermore, during the period of time within which DC is provided, the pressure sensing electrode may achieve a pressure-detecting function. Therefore, the electronic device of the present disclosure not only can detect pressure through the pressure sensing electrode but also can generate the wireless signal through the pressure sensing electrode, thereby communicating with another remote device for wireless-signal transmission.

DETAILED DESCRIPTION

Figure 1:
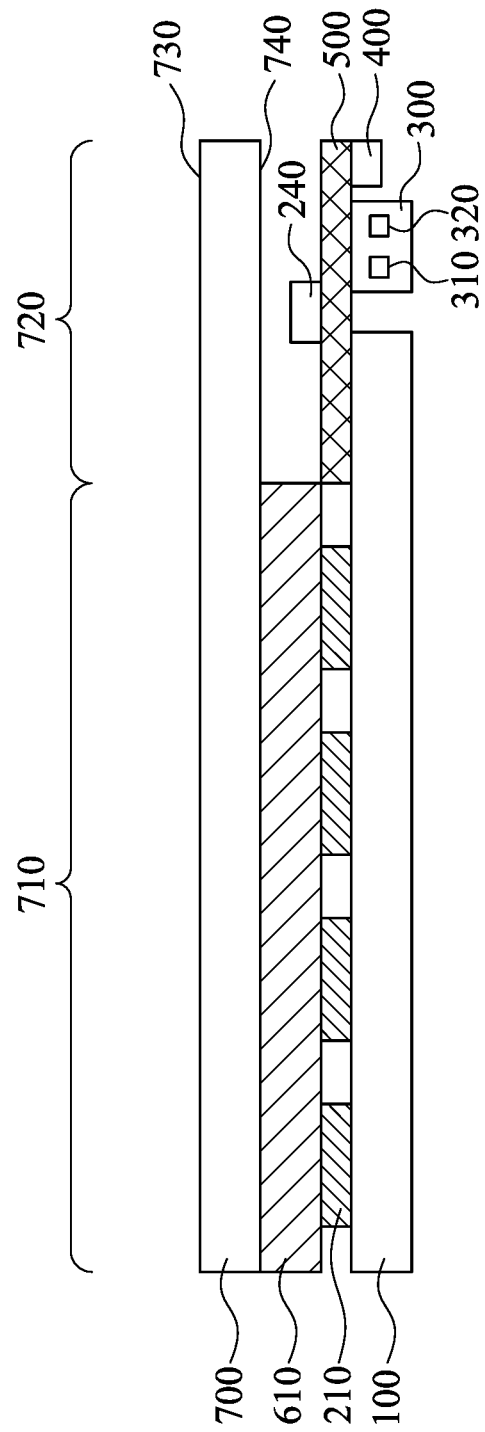
FIG. 1 is a schematic cross-sectional view of an electronic device according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
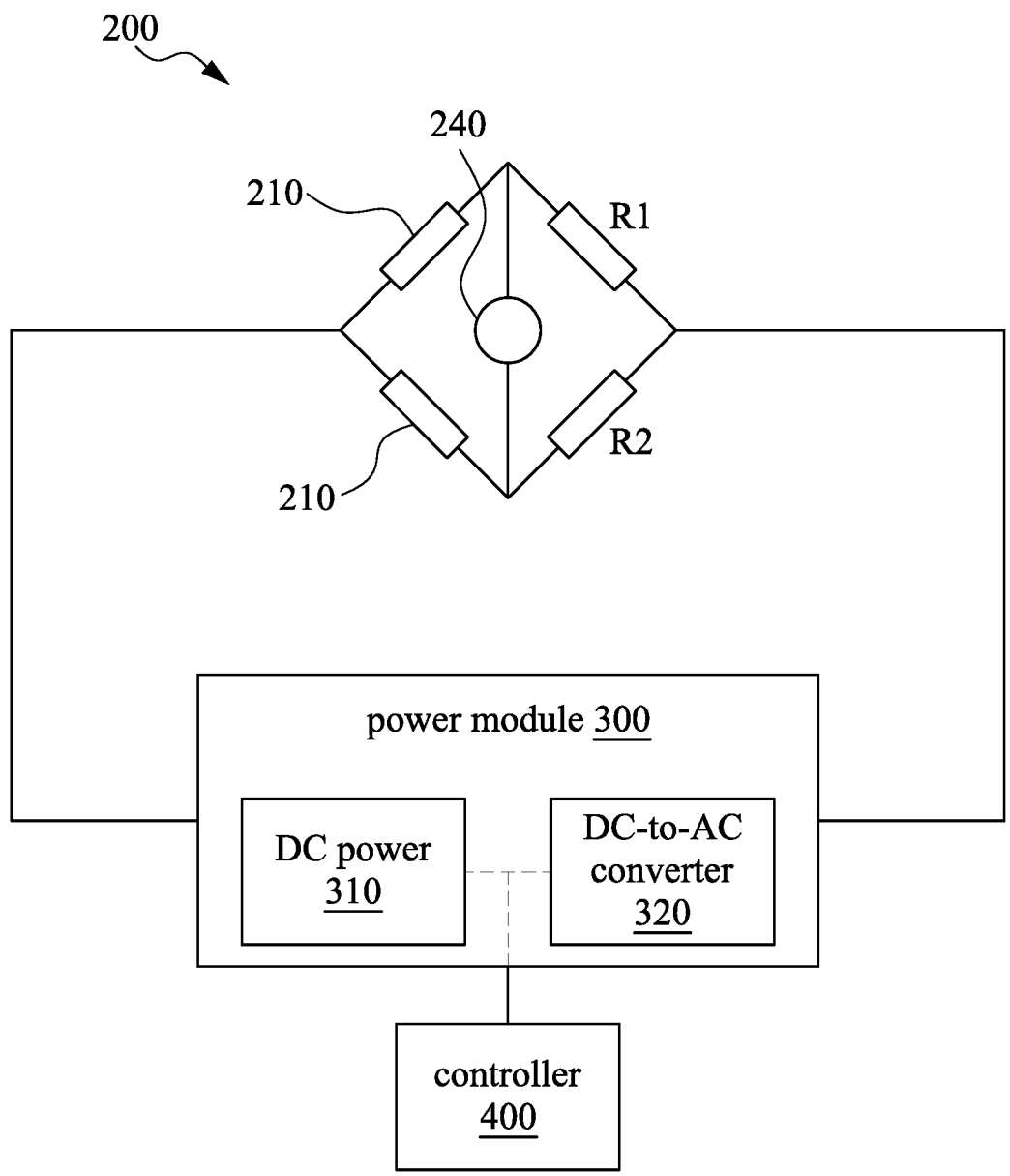
FIG. 2 is an equivalent circuit diagram of a Wheatstone bridge circuit according to an embodiment of the present disclosure.

FIG. 1 is a schematic cross-sectional view of an electronic device according to an embodiment of the present disclosure. FIG. 2 is an equivalent circuit diagram of the electronic device as illustrated in FIG. 1. As shown in FIGS. 1 and 2, in the present embodiment, an electronic device includes a substrate 100, at least one first pressure sensing electrode 210, a power module 300, and a controller 400. The first pressure sensing electrodes 210 are disposed on the substrate 100, in which a resistance of at least one of the first pressure sensing electrodes 210 varies with pressure applied to the corresponding first pressure sensing electrode 210.

In the exemplary configuration of the present embodiment, plural first pressure sensing electrodes 210 are illustrate in FIG. 1, and all of the first pressure sensing electrodes 210 are disposed on the same surface of the substrate 100 and are electrically connected to the power module 300 and the controller 400. In addition, the electronic device further includes a flexible circuit board 500, in which the controller 400 is disposed on the flexible circuit board 500. The controller 400 may be configured to process a touching signal generated from the first pressure sensing electrodes 210. For example, the first pressure sensing electrodes 210 may be electrically connected to the flexible circuit board 500 through at least one electrode connecting wire (not shown in FIG. 1). In some embodiments, a Wheatstone bridge circuit 200 may be collectively formed by the first pressure sensing electrodes 210 and other electronic components disposed on the flexible circuit board 500 or the substrate 100. The Wheatstone bridge circuit 200 may be electrically connected to the power module 300 and the controller 400 to achieve a pressure-sensing function. In other embodiments, the Wheatstone bridge circuit 200 may be formed by four first pressure sensing electrodes 210 disposed on the substrate 100.

Furthermore, after the electronic device is pressed, according to a resistance variation caused by the deformation of the corresponding first pressure sensing electrode 210, the first pressure sensing electrode 210 achieves the pressure-sensing function. For example, a relationship between the deformation of the corresponding first pressure sensing electrode 210 and the resistance variation may satisfy with an equation given as follows: $GF=(\Delta R/R)/(\Delta L/L)$, where GF stands for a gage factor, R stands for an initial resistance of the corresponding first pressure sensing electrode 210, L stands for an initial total length of the corresponding first pressure sensing electrode 210, $\Delta R$ stands for a resistance variation of the corresponding first pressure sensing electrode 210, and $\Delta L$ stands for a total-length variation of the corresponding first pressure sensing electrode 210. According to the equation, when GF, R, L are constants, the larger the $\Delta L$ of the corresponding pressure sensing electrode is, the larger the $\Delta R$ is. Therefore, the controller 400 may calculate a value of the pressure applied to the corresponding first pressure sensing electrode 210 according to the resistance variation $\Delta R$.

Further, during the pressure sensing, direct current (DC) is provided to the Wheatstone bridge circuit 200, so as to be advantageous to detect a stable resistance variation $\Delta R$. In other words, during a period of time of the pressure sensing, the controller 400 may control the power module 300 to provide the DC to Wheatstone bridge circuit 200 within this period of time. However, during another period of time, the controller 400 may control the power module 300 to provide alternating current (AC), which may have a frequency of 60 MHz, to Wheatstone bridge circuit 200, so as to achieve another function besides the pressure-sensing function, such as described below.

Figure 3:
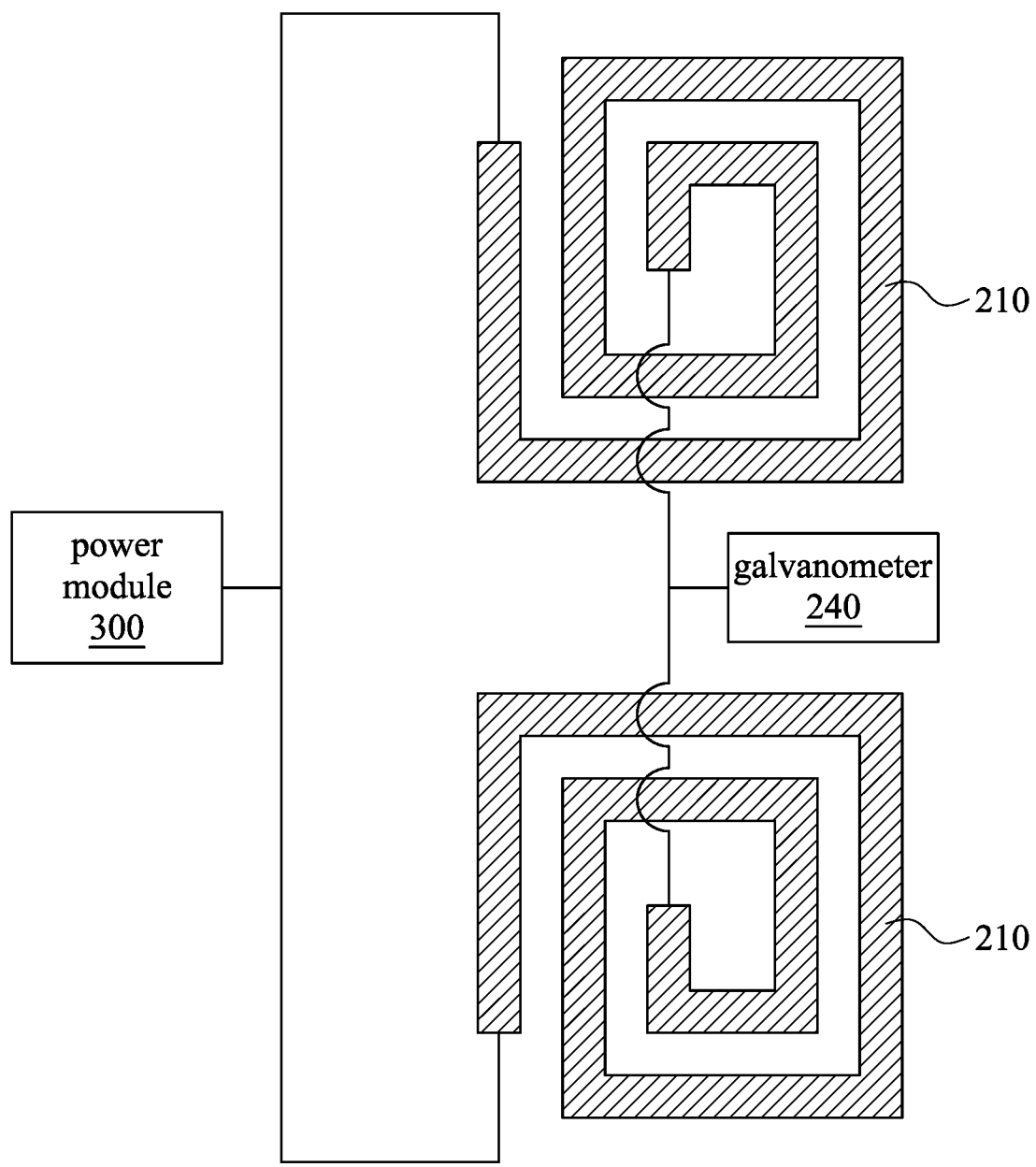
FIG. 3 is a schematic plane view of a pressure sensing electrode according to an embodiment of the present disclosure.

FIG. 3 is a schematic plane view of a pressure sensing electrode according to an embodiment of the present disclosure. As shown in FIG. 3, each of the first pressure sensing electrodes 210 is coil-shaped, such as a circular spiral shape, a square spiral shape, another polygonal spiral shape, or a combination thereof. When current provided by the power module 300 passes through the coil-shaped first pressure sensing electrodes 210, and the first pressure sensing electrodes 210 are deformed by pressing, the Wheatstone bridge circuit 200 may produce alternating voltage. Next, according to the alternating voltage, an alternating magnetic field is produced in respond to the circuit loop function, thereby transmitting a wireless signal in a form of electromagnetic wave. The wireless signal may represent the magnitude of the deformation of at least one of the first pressure sensing electrodes 210 that is under pressure. In other words, when at least one of the first pressure sensing electrode 210 is under pressure, a resistance variation may occur (e.g., become less), thereby resulting in a current variation. Since the current passing through the corresponding first pressure sensing electrode 210 varies (e.g., becomes larger), the magnetic field produced from the corresponding first pressure sensing electrode 210 also varies (e.g., become larger). Therefore, as a pressure is applied to at least one of the first pressure sensing electrode 210 to deform the corresponding first pressure sensing electrode 210, the Wheatstone bridge circuit 200 may produce an electromagnetic wave to transmit the wireless signal.

The Wheatstone bridge circuit 200 may achieve different functions according to different types of voltage (i.e., DC and AC). Accordingly, the controller 400 is able to provide different types of voltage for the Wheatstone bridge circuit 200 within different periods of time, thereby achieving different functions. For example, the controller 400 may control the power module 300 to provide DC to the Wheatstone bridge circuit 200 in a first period of time, so as to achieve the pressure-sensing function. Moreover, the controller 400 may control the power module 300 to provide AC to the Wheatstone bridge circuit 200 in a second period of time, so as to achieve the wireless-signal transmission function. It is understood that the first period of time is different from or does not overlap with the second period of time. As such, the Wheatstone bridge circuit 200 not only can serve as a pressure-sensing component, but also can serve as a wireless-signal transmitting component.

In some embodiments, the power module 300 includes a DC power 310 and a DC-to-AC converter 320. The DC-to-AC converter 320 is electrically connected to the DC power 310 and the controller 400. In the first period of time, the controller 400 may turn off the DC-to-AC converter 320, so as to provide DC to the Wheatstone bridge circuit 200. Therefore, in this period of time, the Wheatstone bridge circuit 200 may sense the magnitude of pressure. In contrast, in the second period of time, the controller 400 may turn on the DC-to-AC converter 320, so as to convert the DC provided by the DC power 310 into AC. Therefore, as the AC passes through the corresponding coil-shaped first pressure sensing electrode 210, the first pressure sensing electrode 210 may produce electromagnetic waves for transmitting a wireless signal. Furthermore, in other embodiments, the power module 300 can be integrated with the controller 400 as a single chip controller.

Reference is made back to FIG. 1. In some embodiments, exemplary materials of the first pressure sensing electrode 210 include indium tin oxide, silver-doped indium tin oxide, silver nanowire, graphene, metal nano-mesh, carbon nanotube, or combinations thereof, but the present disclosure is not limited thereto.

In some embodiments, the flexible circuit board 500 includes at least one bonding point (not illustrated) for bonding at least one bonding pad (not illustrated) disposed on the substrate 100, such that the flexible circuit board 500 can be disposed on the substrate 100. For example, in the embodiments illustrated in FIG. 1, the flexible circuit board 500 and the first pressure sensing electrodes 210 may be disposed on the same surface of the substrate 100. The power module 300 and the controller 400 are disposed on the flexible circuit board 500, such that the controller 400 can be electrically connected to the power module 300 through at least one wire (not illustrated) disposed on the flexible circuit board 500. The power module 300 may be electrically connected to the bonding point through at least one wire (not illustrated) disposed on the flexible circuit board 500.

In some embodiments, the electronic device further includes a galvanometer 240. The galvanometer 240 is disposed on the flexible circuit board 500. In an embodiment, the galvanometer 240 can be integrated with the controller 400 as a single chip controller. In addition, as shown in FIG. 2, the galvanometer 240 is electrically connected to the first pressure sensing electrodes 210 and resistances R1 and R2, so as to form the Wheatstone bridge circuit 200. The galvanometer 240 is configured to detect a variation of the current passing the first pressure sensing electrodes 210 after the first pressure sensing electrodes 210 are pressed, so as to obtain a variation of the resistance of at least one of the first pressure sensing electrodes 210, thereby enabling the controller 400 to calculate the magnitude of the pressure by the controller 400.

Figure 4:
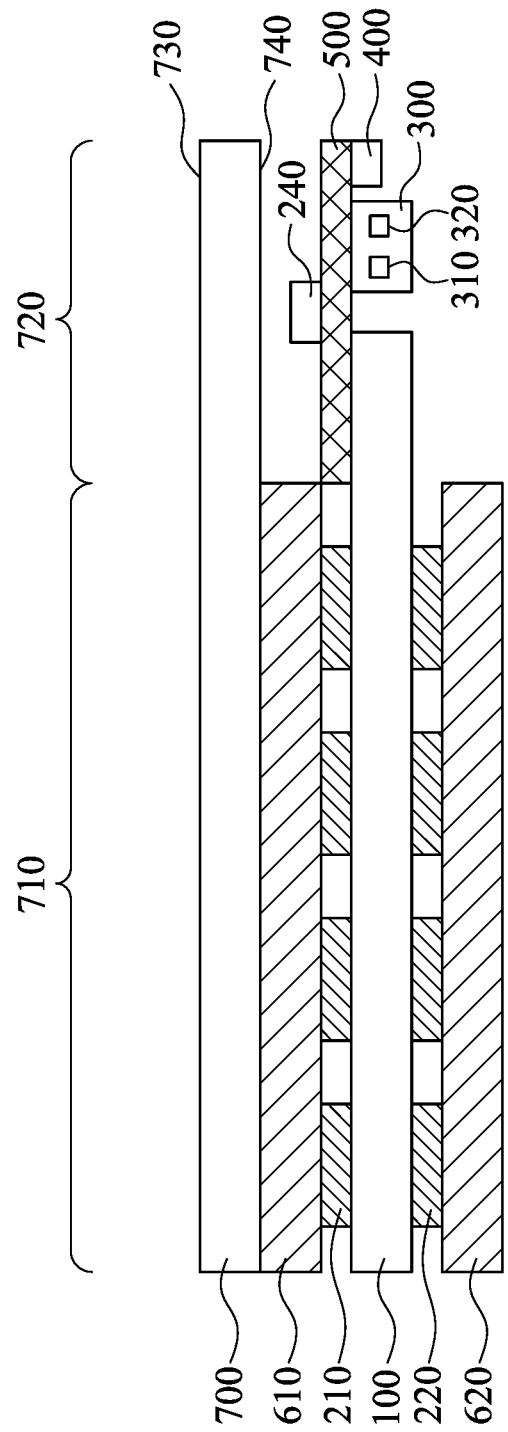
FIG. 4 is a schematic cross-sectional view of an electronic device according to another embodiment of the present disclosure.
Figure 5:
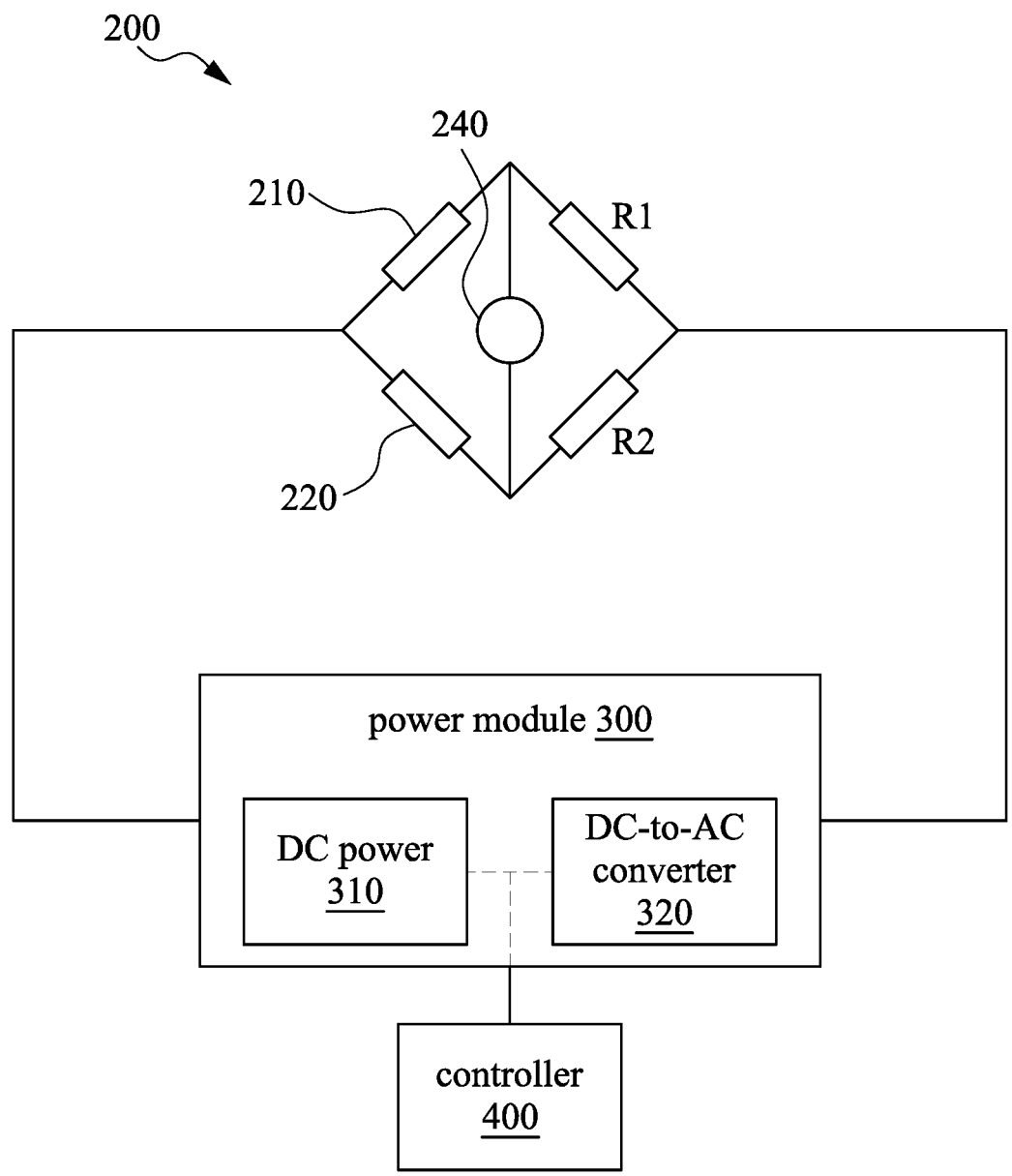
FIG. 5 is an equivalent circuit diagram of a Wheatstone bridge circuit according to another embodiment of the present disclosure.

FIG. 4 is a schematic cross-sectional view of an electronic device according to another embodiment of the present disclosure. FIG. 5 is an equivalent circuit diagram of a Wheatstone bridge circuit according to another embodiment of the present disclosure. The electronic device of the present embodiment is about the same as that illustrated in FIG. 1, with a difference in that the Wheatstone bridge circuit 200 of the present embodiment further includes a second pressure sensing electrode 220. The second pressure sensing electrode 220 and the first pressure sensing electrode 210 are respectively disposed on two opposite surfaces of the substrate 100, in which a resistance of the second pressure sensing electrode 220 varies with a pressure applied to the second pressure sensing electrode 220. Similarly to the previous embodiment, the first pressure sensing electrode 210 and the second pressure sensing electrode 220 are coil-shaped. In some embodiments, as shown in FIG. 5, the Wheatstone bridge circuit 200 may be collectively formed by the first pressure sensing electrode 210, the second pressure sensing electrode 220, and other electronic components disposed on the flexible circuit board 500 or the substrate 100. Similarly to the first pressure sensing electrode 210, when the second pressure sensing electrode 220 is provided with DC, the second pressure sensing electrode 220 and the first pressure sensing electrode 210 can be configured to sense pressure. When the second pressure sensing electrode 220 is provided with AC, an alternating magnetic field can be produced by the Wheatstone bridge circuit 200 due to the circuit loop function, thereby transmitting a wireless signal in a form of electromagnetic wave. The wireless signal may represent the magnitude of the deformation of the first pressure sensing electrode 210 or the second pressure sensing electrode 220 under pressure.

Since the first pressure sensing electrode 210 and the second pressure sensing electrode 220 are disposed on the two opposite surfaces of the substrate 100, two stresses which have the same magnitude but are directed to opposite directions may be applied to the first pressure sensing electrode 210 and the second pressure sensing electrode 220 that are under pressure. For example, as the resistance of the first pressure sensing electrode 210 decreases in response to a compressive stress applied to the first pressure sensing electrode 210, the resistance of the second pressure sensing electrode 220 may increase in respond to a tensile stress applied to the second pressure sensing electrode 220. As such, a ratio of the resistance variation of the first pressure sensing electrode 210 to the resistance variation of the second pressure sensing electrode 220 may increase, thereby improving sensitivity of the pressure sensing.

Figure 6:
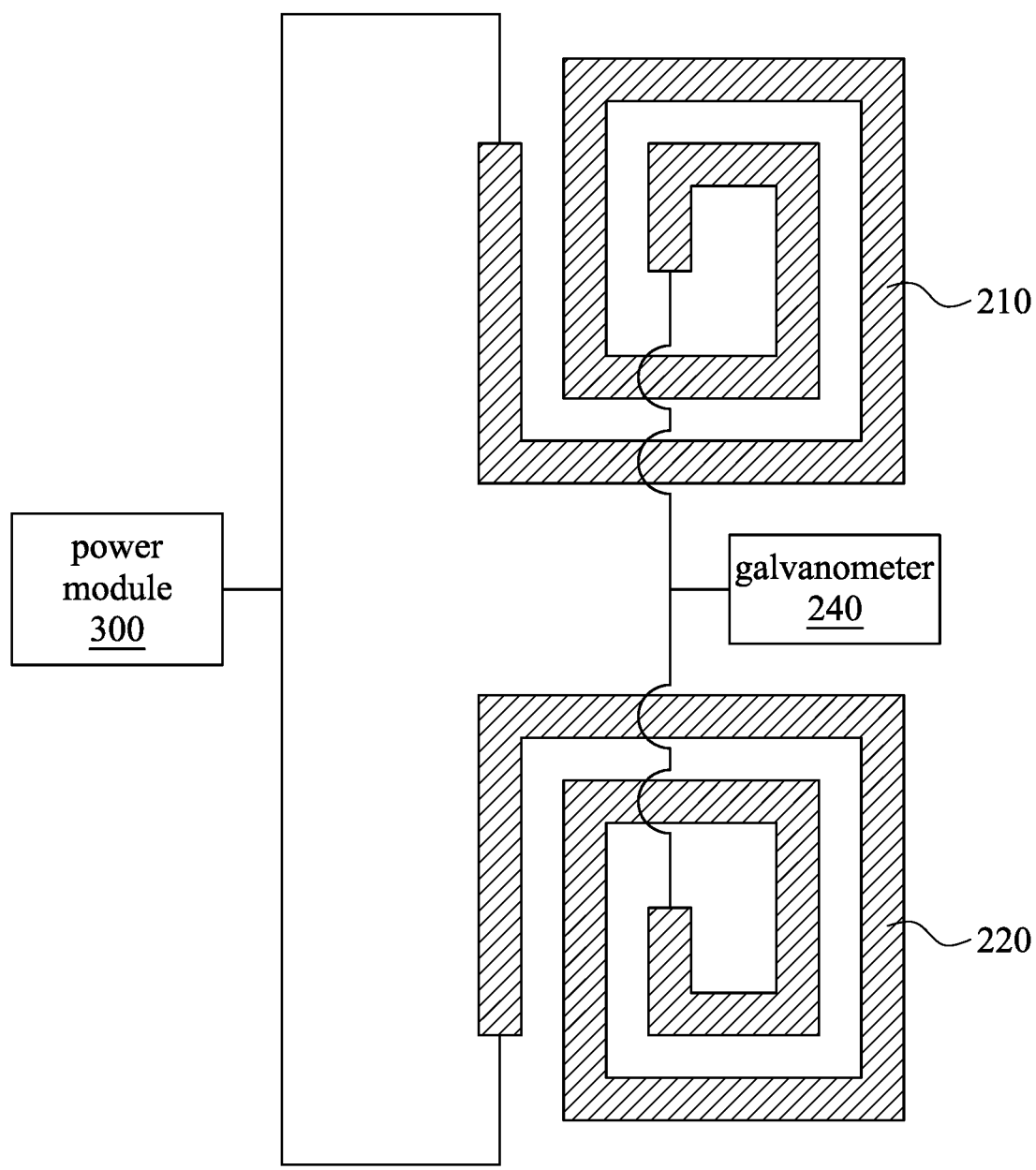
FIG. 6 is a schematic plane view of a pressure sensing electrode according to another embodiment of the present disclosure.

FIG. 6 is a schematic plane view of a pressure sensing electrode according to another embodiment of the present disclosure. As shown in FIG. 6, in some embodiments, when the first pressure sensing electrode 210 and the second pressure sensing electrode 220 are provided with AC, the second pressure sensing electrode 220 and the first pressure sensing electrode 210 may respectively produce magnetic fields with substantially opposite directions. For example, when a current clockwise passes through the first pressure sensing electrode 210 and thus a magnetic field with a downward direction is produced, the current may counterclockwise pass through the second pressure sensing electrodes 220, thereby producing a magnetic field with an upward direction. In other words, when no stress is applied to the first pressure sensing electrode 210 and the second pressure sensing electrode 220, the magnetic fields respectively produced by the first pressure sensing electrode 210 and the second pressure sensing electrode 220 may remain in equilibrium. In contrast, when a stress, such as a compressive stress, is applied to the first pressure sensing electrode 210, a stress, such as a tensile stress directed to a reverse direction to the compressive stress, may be applied to the second pressure sensing electrode 220. Under such a situation, the magnitude of the magnetic field produced by the first pressure sensing electrode 210 increases in response to the compressive stress, and the magnitude of the magnetic field produced by the second pressure sensing electrode 220 decreases in response to the tensile stress. Accordingly, the magnetic fields respectively produced by the first and second pressure sensing electrodes 210 and 220 may not remain in equilibrium, thereby transmitting a wireless signal in a form of electromagnetic wave.

In some embodiments, exemplary materials of the second pressure sensing electrode 220 may be the same as those of the first pressure sensing electrode 210. For example, exemplary materials of the second pressure sensing electrode 220 may include indium tin oxide, silver-doped indium tin oxide, silver nanowire, graphene, a metal nano-mesh, carbon nanotube, or a combination thereof, but the present disclosure is not limited thereto.

According to the embodiment shown in FIG. 4, the flexible circuit board 500 and the first pressure sensing electrode 210 or the second pressure sensing electrode 220 may be disposed at the same surface of the substrate 100. In the embodiment as illustrated in FIG. 4, the substrate 100 may include at least one conductive material and at least one through hole (not illustrated in the figure). As the flexible circuit board 500 and the first pressure sensing electrode 210 are disposed at the same surface of the substrate 100, some of the bonding points of the flexible circuit board 500 may be electrically connected to the second pressure sensing electrode 220 disposed at the opposite surface of the substrate through the conductive material filled in the through hole, or vice versa. In other embodiments, the flexible circuit board 500 may include two terminal portions which are separated from each other, and the two terminal portions respectively include bonding points which are respectively configured to be welded into the bonding pads disposed on the two opposite surfaces of the substrate 100, so as to electrically connect to the first pressure sensing electrode 210 and the second pressure sensing electrode 220. The power module 300 and the controller 400 are disposed on the flexible circuit board 500, such that the controller 400 can be electrically connected to the power module 300 through at least one wire (not illustrated) disposed on the flexible circuit board 500. The power module 300 may be electrically connected to the bonding point through at least one wire (not illustrated in the figure) disposed on the flexible circuit board 500.

Similar to the embodiment illustrated in FIGS. 2 and 3, as shown in FIG. 4 to FIG. 6, in some embodiments, the electronic device further includes a galvanometer 240. The galvanometer 240 is disposed on the flexible circuit board 500. In an embodiment, the galvanometer 240 can be integrated with the controller 400 as a single chip controller. In addition, as shown in FIG. 5, the galvanometer 240 is electrically connected to the first pressure sensing electrode 210, the second pressure sensing electrode 220, and resistances R1 and R2, so as to form the Wheatstone bridge circuit 200. The galvanometer 240 is configured to detect a variation of the current passing the first pressure sensing electrode 210 and/or the second pressure sensing electrode 220 after the corresponding pressure sensing electrode is pressed, so as to obtain a variation of the resistance of the first pressure sensing electrode 210 and/or the second pressure sensing electrode 220, thus enabling the controller 400 to calculate the magnitude of the pressure.

Figure 7:
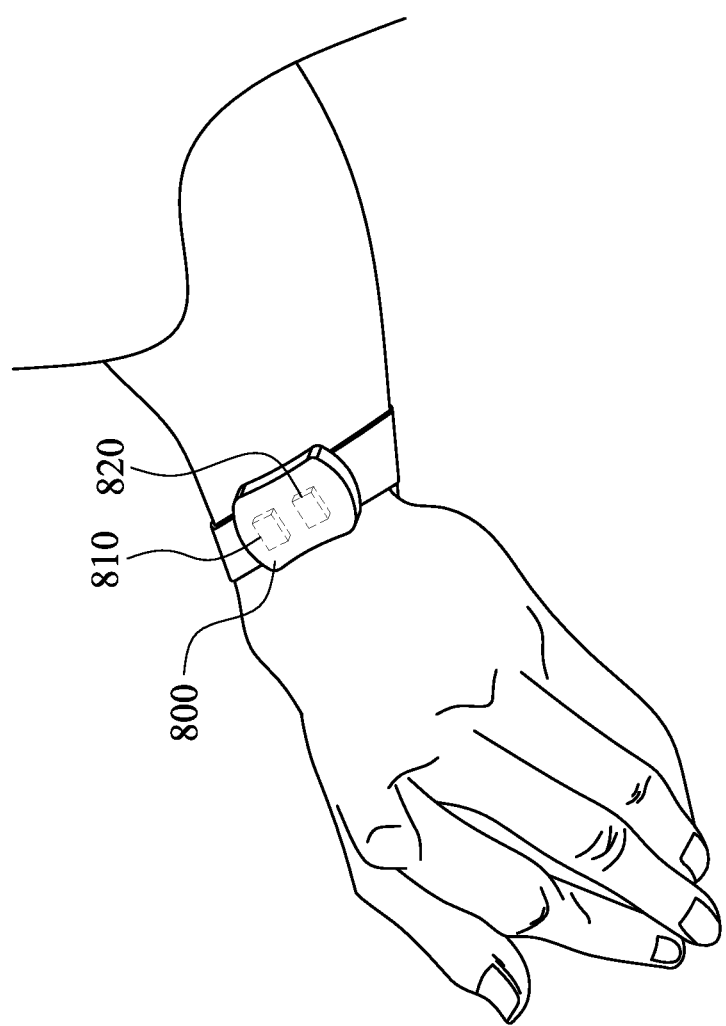
FIG. 7 is a schematic diagram of a wireless controllable electronic assembly according to an embodiment of the present disclosure.
Figure 7:
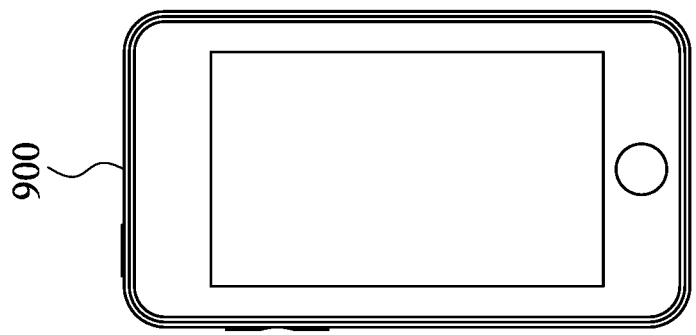

FIG. 7 is a schematic diagram of a wireless controllable electronic assembly according to an embodiment of the present disclosure. As shown in FIG. 7, in some embodiments, a wireless controllable electronic assembly includes an electronic device 900 and a remote device 800. The electronic device 900 may include the Wheatstone bridge circuit 200, the power module 300, and the controller 400 described previously. The remote device 800 may be a wearable device, such as a smart watch. The remote device 800 includes a magnetic field sensing component 810 and an actuator 820. The magnetic field sensing component 810 may be configured to sense a magnetic field and/or a variation of a magnetic field. Therefore, when AC is applied to the Wheatstone bridge circuit 200 of the electronic device 900 and at least one pressure sensing electrode of the electronic device 900 is pressed, the magnetic field sensing component 810 of the remote device 800 is configured to receive a wireless signal emitted from the electronic device 900 and to modulate the wireless signal to generate a control signal. The actuator is configured to change a function state (such as volume control, internet or Bluetooth activation) of the remote device 800 according to the wireless signal generated by the magnetic field sensing component 810. As such, the electronic device 900 may control the function state of the remote device 800 wirelessly according to the magnitude of the pressure applied to the pressure sensing electrode.

Figure 8:
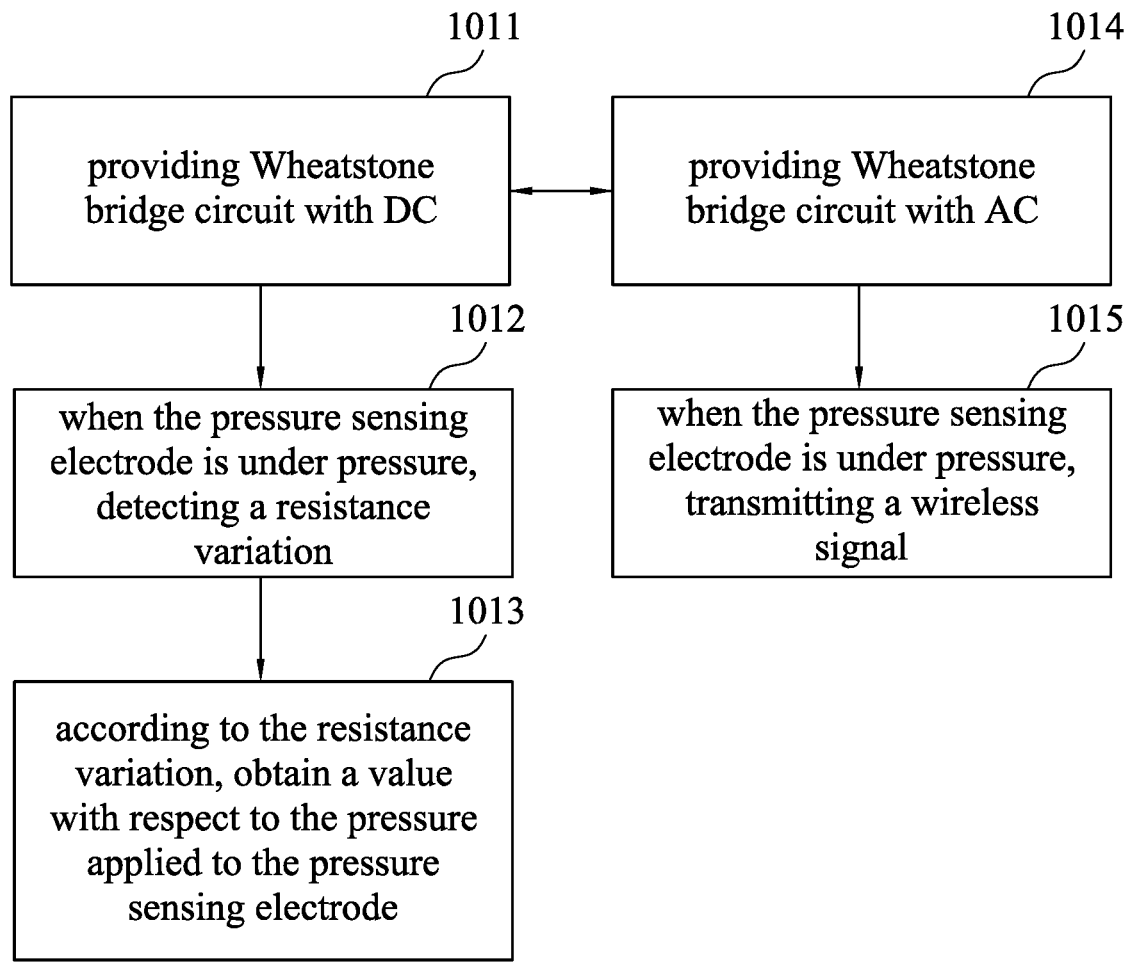
FIG. 8 is a flowchart showing a method for operating an electronic device according to an embodiment of the present disclosure.

FIG. 8 is a flowchart showing a method for operating an electronic device according to an embodiment of the present disclosure. As shown in FIG. 8, a method for operating an electronic device includes steps 1011-1015. The method for operating the electronic device may be performed by switching the steps between a first mode and a second mode. In the first mode, steps 1011-1013 are performed, and in the second mode, steps 1014 and 1015 are performed.

In step 1011, in a first period of time, the controller 400 may turn off the DC-to-AC converter 320, so as to provide DC to the Wheatstone bridge circuit 200 of the electronic device, as described above. Next, step 1012 is performed within the first period of time, in which when the pressure sensing electrode of the Wheatstone bridge circuit 200 is under pressure to cause a resistance variation of a pressure sensing electrode (e.g., a first pressure sensing electrode and/or a second pressure sensing electrode), the resistance variation representing the magnitude of the deformation of the pressure sensing electrode under pressure is detected. Next, step 1013 is performed within in the first period, in which according to the resistance variation, a value of the pressure applied to the pressure sensing electrode is obtained.

In step 1014, in a second period of time which is different from the first period of time, the controller 400 may turn on the DC-to-AC converter, so as to provide AC to the Wheatstone bridge circuit 200 of the electronic device. Next, step 1015 is performed, in the second period of time, when the pressure sensing electrode of the Wheatstone bridge circuit is under pressure to cause the resistance variation of the pressure sensing electrode (e.g., a first pressure sensing electrode and/or a second pressure sensing electrode), at least one radio wave is produced to transmit a wireless signal for transmitting the resistance variation which is detected in the first period of time and represents the magnitude of the deformation of the pressure sensing electrode under pressure. In addition, an external device (e.g., the remote device 800 as illustrated in FIG. 7) for receiving the radio wave can switch on or determine whether to receive the radio wave.

In some embodiments, as illustrated in FIG. 1, the electronic device further includes a first insulation layer 610 and a cover plate 700. The first pressure sensing electrodes 210 are covered by the first insulation layer 610, and the first insulation layer 610 is covered with the cover plate 700. The cover plate 700 has a transparent area 710 and an opaque area 720, in which the opaque area 720 is located at one side of the transparent area 710. In some embodiments, the power module 300, the controller 400, and the flexible circuit board 500 are covered by the opaque area 720.

In some embodiments, as illustrated in FIG. 4, the electronic device further includes a first insulation layer 610, a second insulation layer 620, and a cover plate 700. The first pressure sensing electrodes 210 are covered by the first insulation layer 610, and the first insulation layer 610 is covered with the cover plate 700. The second pressure sensing electrode 220 are covered by the second insulation layer 620. The cover plate 700 has a transparent area 710 and an opaque area 720, in which the opaque area 720 is located at one side of the transparent area 710. In some embodiments, the power module 300, the controller 400, and the flexible circuit board 500 are covered by the opaque area 720.

In some embodiments, as illustrated in FIGS. 1 and 4, the first pressure sensing electrodes 210 are covered by transparent area 710. The cover plate 700 has a first surface 730 and a second surface 740 which are disposed opposite to each other. The first surface is configured to provide a touch area for a user. Exemplary materials of the cover plate 700 include hardened plastic, strengthened glass, sapphire glass, or other suitable hardened plates. Exemplary materials of the substrate 100 include rigid substrates, such as glass, tempered glass, or sapphire glass, but the present disclosure is not limited thereto. Exemplary materials of the substrate 100 may be flexible substrates, such as polyetheretherketone (PEEK), polyimide (PI), polyethylene terephthalate (PET), polycarbonate (PC), polyethylene succinate (PES), polymethylmethacrylate (PMMA), or combinations thereof, but the present disclosure is not limited thereto.

Figure 9:
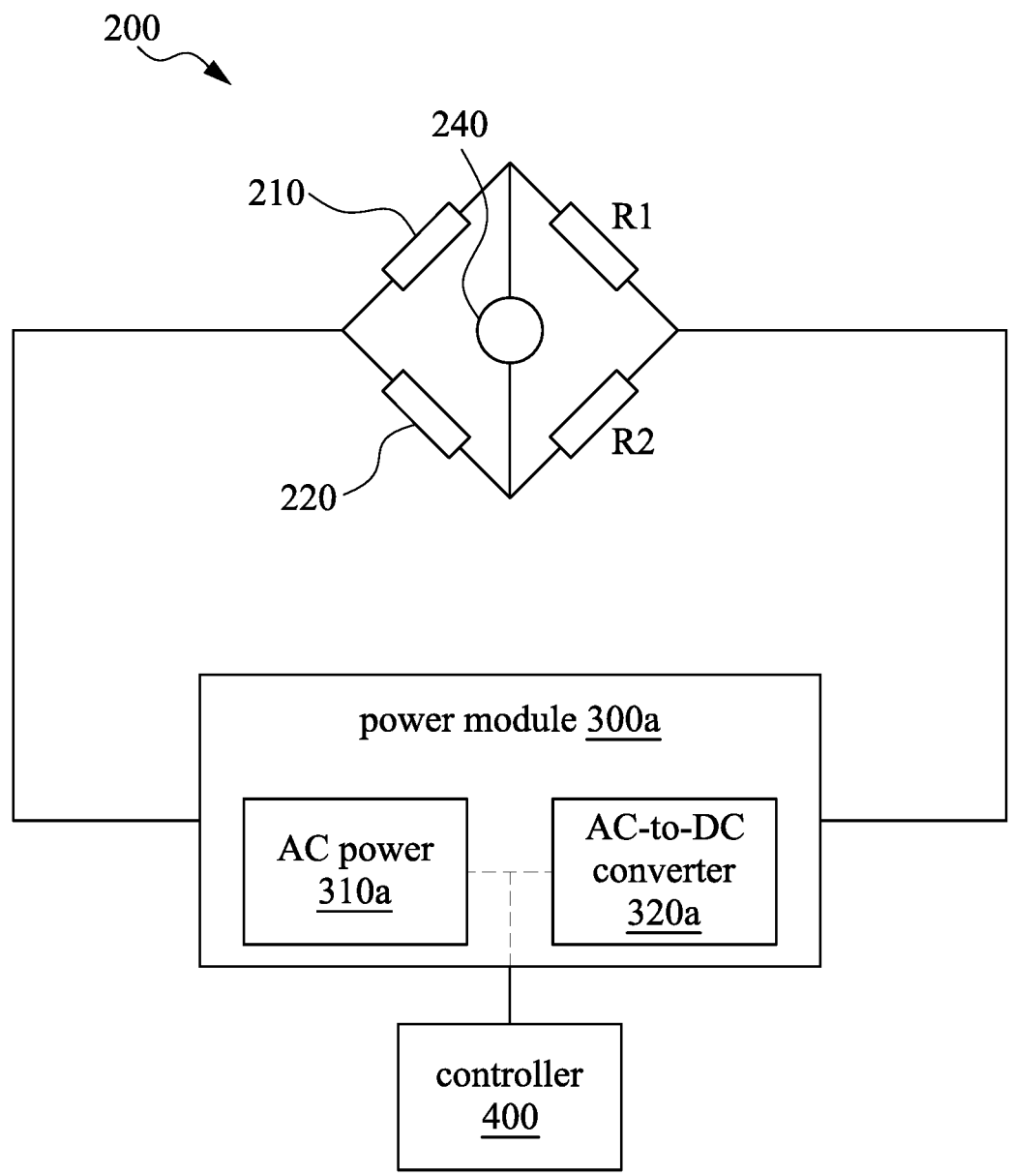
FIG. 9 is an equivalent circuit diagram of a Wheatstone bridge circuit according to another embodiment of the present disclosure.

FIG. 9 is an equivalent circuit diagram of a Wheatstone bridge circuit according to another embodiment of the present disclosure. At least one difference between a pressure sensing component of the present embodiment and the pressure sensing component of the above embodiments is that a power module 300a of the present embodiment includes an AC power 310a and an AC-to-DC converter 320a. The AC-to-DC converter 320a is electrically connected to the AC power 310a and a controller 400. In a first period of time, the controller 400 may turn on the AC-to-DC converter 320a, so as to covert AC provide by the AC power 310a into DC. Accordingly, the DC is provided to the Wheatstone bridge circuit 200 for performing pressure sensing. In a second period of time, the controller 400 may turn off the AC-to-DC converter 320a, such that the AC provide by the AC power 310a is provided to the Wheatstone bridge circuit 200. Therefore, when the AC passes through the coil-shaped first and second pressure sensing electrodes, at least one electromagnetic wave is produced to transmit at least one wireless signal. Other components of the configuration illustrated in FIG. 9 are similar to those of the configuration illustrated in FIGS. 1 and 2, and thus the detailed explanation are omitted herein.

Figure 10:
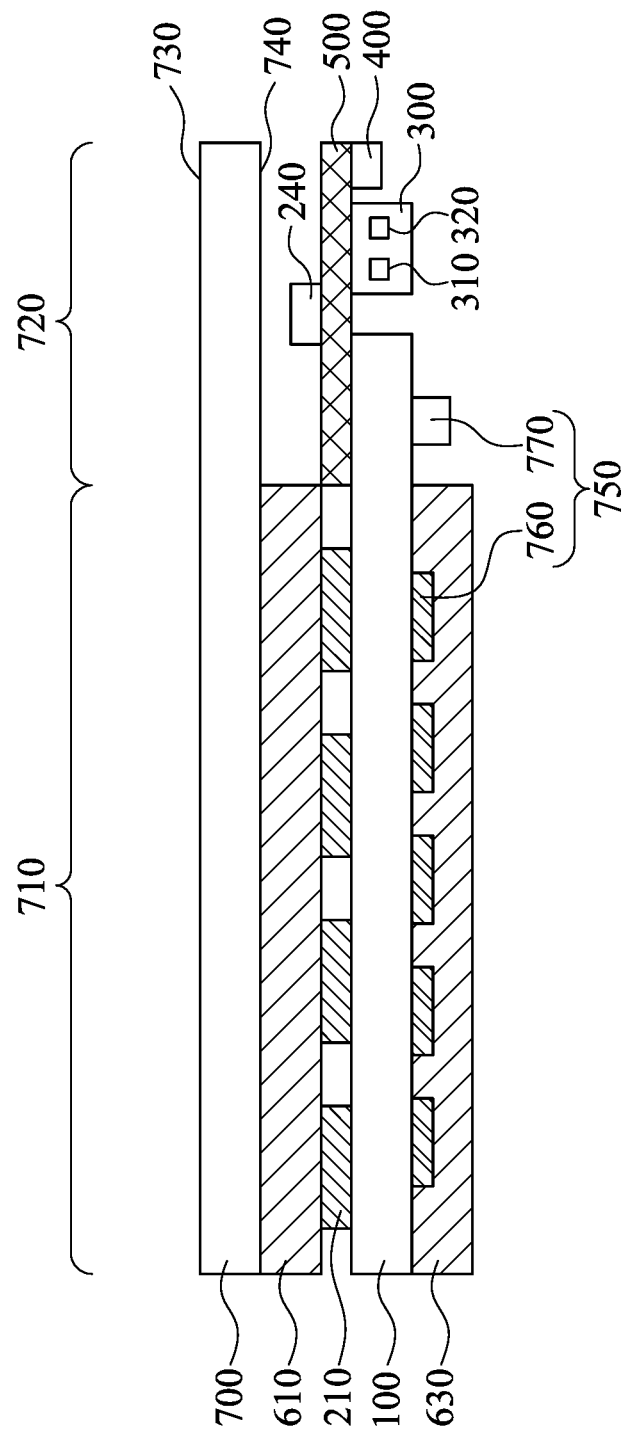
FIG. 10 is a schematic cross-sectional view of an electronic device according to yet another embodiment of the present disclosure.

FIG. 10 is a schematic cross-sectional view of an electronic device according to yet another embodiment of the present disclosure. As shown in FIG. 10, the electronic device may further include a touch-sensing module 750. The touch-sensing module 750 is disposed under the cover plate 700 and is stacked with the Wheatstone bridge circuit 200 including the first pressure sensing electrodes 210. For example, in the configuration illustrated in FIG. 10, the touch-sensing module 750 and the Wheatstone bridge circuit 200 are respectively disposed on two opposite surfaces of the substrate 100.

Concretely speaking, as shown in the embodiments illustrated in FIG. 10, the touch-sensing module 750 is located at a bottom surface of the substrate 100. The touch-sensing module 750 includes touch-sensing electrodes 760 and a driver 770. The touch-sensing electrodes 760 may be disposed under the bottom surface of the substrate 100 and in contact with the bottom surface of the substrate 100, and the touch-sensing electrodes 760 are located within the transparent area 710. A vertical projection of the touch-sensing electrode 760 on the substrate 100 at least partially overlaps with a vertical projection of the first pressure sensing electrode 210 on the substrate 100. The driver 770 is located within the opaque area 720 and is electrically connected to the touch-sensing electrodes 760. Furthermore, the touch-sensing electrodes 760 may include plural electrode pads covered by a third isolation layer 630.

When the electronic device is touched, the driver 770 may calculate a touch position through a capacitance variation coupled by the touch-sensing electrodes 760. In the meantime, the Wheatstone bridge circuit formed by the first pressure sensing electrodes 210 may also function to integrate the sensing pressure function, the generating wireless signal function, and the touch function into the same electronic device. The position of the touch-sensing module 750 described above is shown as an example. The touch-sensing module 750 may be disposed at other positions. In other embodiments, the touch-sensing module 750 and the Wheatstone bridge circuit including the first pressure sensing electrodes 210 may be disposed at the same side of the substrate 100. For example, the touch-sensing module 750 may be disposed between the cover plate 700 and the first pressure sensing electrodes 210, and is stacked with the first pressure sensing electrodes 210. In addition, the touch-sensing module 750 may include at least one isolation layer or base, such that the touch-sensing module 750 can be integrated into the internal structure of the electronic device.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the invention. In view of the foregoing, it is intended that the present disclosure cover modifications and variations of the present disclosure provided they fall within the scope of the following claims.

What is claimed is:

1. An electronic device, comprising:
a Wheatstone bridge circuit;
a power module electrically connected to the Wheatstone bridge circuit; and
a controller configured to control the power module to provide direct current (DC) and alternating current (AC) to the Wheatstone bridge circuit within different periods of time, wherein:
a resistance of the Wheatstone bridge circuit changes as a function of a pressure applied to the Wheatstone bridge circuit when the Wheatstone bridge circuit is receiving the direct current,
a property of a wireless signal generated by the Wheatstone bridge circuit changes as a function of the pressure applied to the Wheatstone bridge circuit when the Wheatstone bridge circuit is receiving the alternating current,
a current path of the direct current flowing through the Wheatstone bridge circuit and a current path of the alternating current flowing through the Wheatstone bridge circuit are the same.

2. The electronic device of claim 1, wherein the power module comprises:
a DC power source; and
a DC-to-AC converter electrically connected to the DC power source and the controller.

3. The electronic device of claim 1, wherein the power module comprises:
an AC power source; and
an AC-to-DC converter electrically connected to the AC power source and the controller.

4. The electronic device of claim 1, further comprising:
a substrate, wherein the Wheatstone bridge circuit further comprises:
a first pressure sensing electrode disposed on the substrate, wherein a resistance of the first pressure sensing electrode varies with pressure applied to the first pressure sensing electrode, and the first pressure sensing electrode is coil-shaped; and
a second pressure sensing electrode, wherein the first pressure sensing electrode and the second pressure sensing electrode are respectively disposed on opposite surfaces of the substrate, a resistance of the second pressure sensing electrode varies with pressure applied to the second pressure sensing electrode, and the second pressure sensing electrode is coil-shaped.

5. The electronic device of claim 4, further comprising:
a cover plate that covers the substrate and has a transparent area and an opaque area, wherein the opaque area is located at a side of the transparent area, and the power module is covered by the opaque area.

6. The electronic device of claim 5, wherein the first pressure sensing electrode is covered by the transparent area.

7. The electronic device of claim 1, further comprising:
a substrate; and
a flexible circuit board disposed on the substrate, wherein the controller is disposed on the flexible circuit board.

8. The electronic device of claim 4, further comprising:
a galvanometer electrically connected to at least one of the first pressure sensing electrode or the second pressure sensing electrode and configured to detect a resistance variation caused by at least one of the pressure applied to the first pressure sensing electrode or the pressure applied to the second pressure sensing electrode.

9. The electronic device of claim 4, further comprising:
a touch sensing electrode, wherein a vertical projection of the touch sensing electrode on the substrate at least partially overlaps with a vertical projection of the first pressure sensing electrode on the substrate.

10. A wireless controllable electronic assembly, comprising:
an electronic device, comprising:
a Wheatstone bridge circuit;
a power module electrically connected to the Wheatstone bridge circuit; and
a controller configured to control the power module to provide direct current (DC) and alternating current (AC) to the Wheatstone bridge circuit within different periods of time, wherein:
a resistance of the Wheatstone bridge circuit changes as a function of a pressure applied to the Wheatstone bridge circuit when the Wheatstone bridge circuit is receiving the direct current,
a property of a wireless signal generated by the Wheatstone bridge circuit changes as a function of the pressure applied to the Wheatstone bridge circuit when the Wheatstone bridge circuit is receiving the alternating current, and
a current path of the direct current flowing through the Wheatstone bridge circuit and a current path of the alternating current flowing through the Wheatstone bridge circuit are the same; and
a remote device, comprising:
a magnetic field sensing component configured to receive and modulate the wireless signal emitted from the electronic device to generate a control signal; and
an actuator configured to change a function state of the remote device according to the control signal generated by the magnetic field sensing component.

11. The electronic assembly of claim 10, wherein the power module comprises:
a DC power source; and
a DC-to-AC converter electrically connected to the DC power source and the controller.

12. The electronic assembly of claim 10, wherein the power module comprises:
an AC power source; and
an AC-to-DC converter electrically connected to the AC power source and the controller.

13. The electronic assembly of claim 10, further comprising:
a substrate, wherein the Wheatstone bridge circuit further comprises:
a first pressure sensing electrode disposed on the substrate, wherein a resistance of the first pressure sensing electrode varies with pressure applied to the first pressure sensing electrode, and the first pressure sensing electrode is coil-shaped; and
a second pressure sensing electrode, wherein the first pressure sensing electrode and the second pressure sensing electrode are respectively disposed on opposite surfaces of the substrate, a resistance of the second pressure sensing electrode varies with pressure applied to the second pressure sensing electrode, and the second pressure sensing electrode is coil-shaped.

14. The electronic assembly of claim 13, further comprising:
a cover plate that covers the substrate and has a transparent area and an opaque area, wherein the opaque area is located at a side of the transparent area, and the power module is covered by the opaque area.

15. The electronic assembly of claim 10, further comprising:
a substrate; and
a flexible circuit board disposed on the substrate, wherein the controller is disposed on the flexible circuit board.

16. The electronic assembly of claim 13, further comprising:
a galvanometer electrically connected to at least one of the first pressure sensing electrode or the second pressure sensing electrode and configured to detect a resistance variation caused by at least one of the pressure applied to the first pressure sensing electrode or the pressure applied to the second pressure sensing electrode.

17. The electronic assembly of claim 13, further comprising:
a touch sensing electrode, wherein a vertical projection of the touch sensing electrode on the substrate at least partially overlaps with a vertical projection of the first pressure sensing electrode on the substrate.

18. A method for operating an electronic device, the method comprising:
in a first period of time, providing direct current (DC) to a Wheatstone bridge circuit of the electronic device;
in the first period of time, receiving, by the Wheatstone bridge circuit, the direct current and generating a resistance variation as a function of a pressure applied to the Wheatstone bridge circuit when the Wheatstone bridge circuit is receiving the direct current;
in a second period of time that is different from the first period of time, providing alternating current (AC) to the Wheatstone bridge circuit of the electronic device; and
in the second period of time, receiving, by the Wheatstone bridge circuit, the alternating current and generating a wireless signal in response to receiving the alternating current, wherein a current path of the direct current flowing through the Wheatstone bridge circuit and a current path of the alternating current flowing through the Wheatstone bridge circuit are the same.

19. The electronic device of claim 1, wherein the controller calculates a value of the pressure applied to the electronic device according to a resistance variation when the Wheatstone bridge circuit is receiving the direct current.

20. The electronic device of claim 4, wherein current from the power module flows through the first pressure sensing electrode in a clockwise direction and the current flows through the second pressure sensing electrode in a counter-clockwise direction.

* * * * *